United States Patent [19]

Dolezal et al.

[11] Patent Number: 5,098,863

[45] Date of Patent: Mar. 24, 1992

[54] METHOD OF STABILIZING LEAD DIMENSIONS ON HIGH PIN COUNT SURFACE MOUNT I.C. PACKAGES

[75] Inventors: Mitch Dolezal, Phoenix; Debendra Mallik, Mesa; Steve Prough, Phoenix, all of Ariz.

[73] Assignee: Intel Corporation, Santa Clara, Calif.

[21] Appl. No.: 619,871

[22] Filed: Nov. 29, 1990

[51] Int. Cl.$^5$ ............................................. H01L 21/56
[52] U.S. Cl. ................................... 437/211; 437/220; 29/827; 29/840; 29/841; 228/180.1; 439/876
[58] Field of Search ................... 437/209, 211, 220; 29/827, 840, 841; 228/180.1; 439/876

[56] References Cited

U.S. PATENT DOCUMENTS

| 4,280,132 | 7/1981 | Hayakawa et al. | 437/211 |
|---|---|---|---|
| 4,835,120 | 5/1989 | Mallik et al. | 437/209 |
| 4,859,614 | 8/1989 | Sugahara et al. | 437/8 |
| 4,859,632 | 8/1989 | Lumbard | 437/209 |
| 4,908,337 | 3/1990 | Treffer | 29/827 |

FOREIGN PATENT DOCUMENTS

| 2568059 | 1/1986 | France | 437/209 |
|---|---|---|---|
| 53-80968 | 7/1978 | Japan | 437/211 |
| 58-28841 | 2/1983 | Japan | 437/211 |
| 60-92624 | 5/1985 | Japan | 437/211 |
| 61-292945 | 12/1986 | Japan | 437/217 |
| 63-198339 | 8/1988 | Japan | 437/209 |

Primary Examiner—Olik Chaudhuri
Assistant Examiner—Andrew Griffis
Attorney, Agent, or Firm—Blakely, Sokoloff, Taylor & Zafman

[57] ABSTRACT

A method for packaging integrated circuits for surface mount which provides advantages over prior art techniques by providing increased strength to integrated circuit package leads for increased lead dimensional stability to accommodate the finer pitches needed for high density integrated circuits, i.e., with leadcounts of 200 or more leads. The method is for producing a plastic integrated circuit package that allows for transfer molding using a non-conductive, permanent dambar. The invention includes the resulting leadframe. The method produces a package having embedded leads (on both sides and in between) in a double sided film/adhesive combination which increases lead dimensional stability and which does not require removal before device mounting. The double sided film/adhesive combination is non-conductive, is able to withstand all the package assembly process steps and is applied before a die is dedicated to a leadframe. The non-conductive film-/adhesive combination on both sides of the leadframe performs the function of a dambar which does not require removal before testing and/or device mounting. The film/adhesive combination also functions as a gasket to eliminate flashing during molding. A laminated copper and film/adhesive combination is used as a test ring that matches the leadframe thermal coefficient of expansion and is applied before a die is dedicated to the leadframe. By having the ring segmented instead of one solid piece, forming the leads before trimming them is possible.

7 Claims, 2 Drawing Sheets

METHOD OF STABILIZING LEAD DIMENSIONS ON HIGH PIN COUNT SURFACE MOUNT I.C. PACKAGES

BACKGROUND OF THE INVENTION

The invention is directed to an integrated circuit package which provides increased strength to surface mount integrated circuit package leads for increased lead dimensional stability as compared to prior art integrated circuit packages. The invention is also directed to methods for making the improved packaging. The invention is also directed to a method for producing a plastic integrated circuit package that allows for transfer molding using a non-conductive, permanent dambar.

In the prior art, the following integrated circuit packages are known:

a. Bare, formed leads with no additional support added.

b. Leadframes that use conductive metal dambars which must be removed before testing and/or mounting.

c. Molded test rings and pre-molded test rings.

When using prior art unsupported formed leads, the leadframe material is necessarily thinner as leads get narrower to accommodate the finer pitches needed for high density integrated circuits, i.e., with leadcounts of 200 or more leads. These higher leadcounts generally require, centerline to centerline pitch of less than 0.025 inch. The reduced cross-section of the leads reduces their strength and increases the likelihood of losing their dimensional integrity.

When dambars are used to provide additional strength when finer pitches are used, removal of the dambars requires mechanical punches to pierce the portions of the dambar in between the leads without damaging the leads. As the pitch between leads decreases, so must the width of the punch. As the punch decreases in width, its strength is reduced and the leadframe material must be reduced to compensate for the reduced strength. The reduction in material thickness reduces the transverse and lateral strength of the leads, making them more prone to damage.

Although lasers are used as another method for removing dambars, this method also requires the leadframe material thickness to be reduced, thereby causing the same lead damage problem as exists when using mechanical punches.

In addition, proper alignment of the leads and dambar punches is critical, especially as the pitch decreases, to insure correct lead widths. Due to tolerance build-up between the leadframe guide holes, alignment pins, and punches, a consistent cross section of the leads is very difficult. This lack of consistency is not only a cosmetic concern, but can also affect the uniform formability of the leads.

Additionally, because of the clearances required between the punches and the leads, a small amount of extraneous material (epoxy material that flows from the body to the dambar in between the leads) will remain after a mechanical deflashing process which is a process to remove the very thin coat of resin that bleeds out onto the surfaces of the leads. Normally, it is removed by chemically dissolving the flash and/or by bombarding the affected surfaces with small plastic beads (called media deflash process). Unless the flash is removed, it is difficult to coat the leads with tin/lead solder which is required for mounting onto printed circuit boards. Not only is this extraneous material a cosmetic concern, it is also a potential source of contamination on the leads or damage to the leads if the extraneous material were to break away during subsequent assembly and test steps.

When a molded test ring is used to provide additional strength when finer pitches are used, multiple metal dambars are also needed, one for the package and two for the ring. These dambars have the same disadvantages as described above.

Additionally, a molded test ring has a different thermal coefficient of expansion than that of the leadframe which is ordinarily made of copper. The difference in the thermal coefficient of expansion leads to flatness issues wherein for electrical testing, test probes (which lie on a plane) make contact with corresponding leads of the package prior to forming for lead pitches less than 0.025 inch center line to center line. For a molded carrier ring, the leads lie on the surface of the carrier ring which generally warps. Consequently, not all test probes are able to make contact with corresponding leads with a reasonable amount of pressure. A large pressure may damage or lower the life of the probes which makes testing at very fine pitches (e.g., less than 0.4 mm) very difficult.

Furthermore, a molded test ring or a pre-molded test ring require the leads to be cut free from the ring before forming free leads. Forming free leads, as opposed to leads still tied together, gives less control over formability and positional integrity.

Another disadvantage to techniques using a molded test ring or pre-molded test ring is that both molded test rings and premolded test rings are added during assembly, after a die has been dedicated to the leadframe. Any yield loss associated with the molding of the test ring or attachment of the pre-molded test ring results in a lost die.

SUMMARY OF THE INVENTION

A method is disclosed for packaging integrated circuits for surface mount which provides advantages over prior art techniques by providing increased strength to integrated circuit package leads for increased lead dimensional stability to accommodate the finer pitches needed for high density integrated circuits, i.e., with leadcounts of 200 or more leads. These higher leadcounts generally require a centerline to centerline pitch of less than 0.025 inch.

More particularly, the invention is directed to a method for producing a plastic integrated circuit package that allows for transfer molding using a non-conductive, permanent dambar. The method produces a package having embedded leads (on both sides and in between) in a double sided film/adhesive combination which increases lead dimensional stability and which does not require removal before device mounting. The double sided film/adhesive combination is non-conductive, is able to withstand all the package assembly process steps and is applied before a die is dedicated to a leadframe. The non-conductive film/adhesive combination on both sides of the leadframe performs the function of a dambar which does not require removal before testing and/or device mounting. The film/adhesive combination also functions as a gasket to eliminate flashing during molding. Use of the invention allows for an increased time between mold resurfacing maintenance.

The invention also teaches the use of laminated copper and film/adhesive combination which is used as a test ring that matches the leadframe thermal coefficient of expansion and is applied before a die is dedicated to the leadframe. In this manner, the test ring allows the package to be formed before the ring is removed.

DETAILED DESCRIPTION OF THE INVENTION

The invention is directed mainly to i) a method which produces certain modifications and additions to a leadframe used for packaging integrated circuits for surface mount; and ii) the resulting leadframe. The invention may be utilized to accommodate the finer pitches needed for high density integrated circuits, i.e., with leadcounts of 200 or more leads. These higher leadcounts generally require, a centerline to centerline pitch of less than 0.025 inch.

The invented method produces a plastic integrated circuit package that allows for transfer molding using a non-conductive, permanent dambar. The invention also teaches the use of laminated copper and film/adhesive combination which is used as a test ring that matches the leadframe thermal coefficient of expansion and is applied before a die is dedicated to the leadframe.

Figure 1:
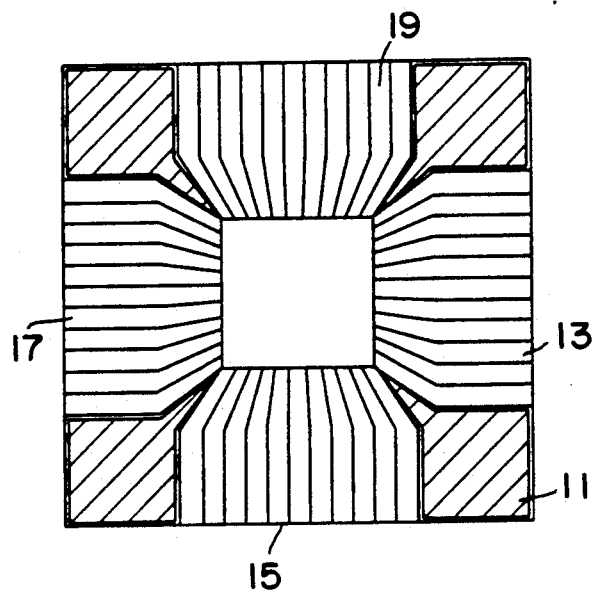
FIG. 1 is a top plan view of a prior art leadframe with four sets of leads, one set on each side of the leadframe.
Figure 2:
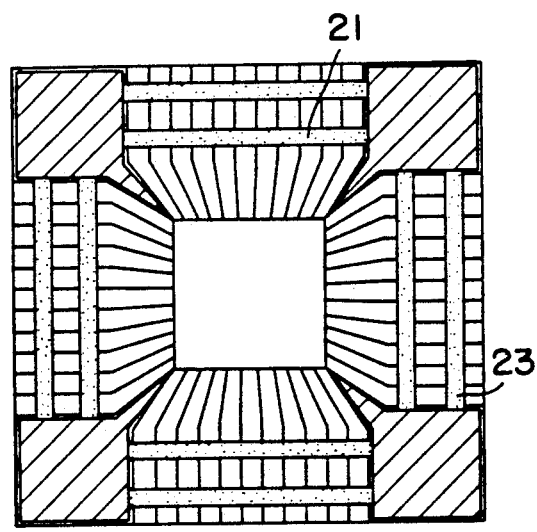
FIG. 2 is a top plan view of a leadframe according to the present invention after a film/adhesive combination has been added so that there are two strips of the film/adhesive combination on each side of each set of leads.

To practice the invention, first, a bare leadframe is formed as in the prior art as shown in FIG. 1, but without the metal dambars. In this connection, the invention will be described with reference to a leadframe having four sets of leads 13, 15, 17 and 19. However, the invention is not so limited and may be practiced with a different number of sets of leads depending upon the configuration of the integrated circuit being packaged. To the bare leads, sixteen strips of film/adhesive are added as shown in FIG. 2, four to each set of leads for a total of eight on top of the leadframe and eight on bottom of the leadframe. The eight inner strips 21 act as dambars and add strength to the leads. These inner strips only have adhesive on the side facing the leadframe. The eight outer strips 23 help support the leads after singulation and insulate the leads from shorting against copper strips which are added as described below with reference to FIG. 3. These outer strips have adhesive on both sides. The sixteen strips are physically coupled to the leads by hot tacking all the strips without completely curing the adhesive. In the preferred embodiment, the film is Kapton[1] and the adhesive is polyimide. The film/adhesive combination is formed by a conventional adhesive coating process. A suitable film/adhesive combination may be obtained from Tomoegawa Paper Company, Ltd. of Japan.

Trademark of E. I. DuPont Company

Figure 3:
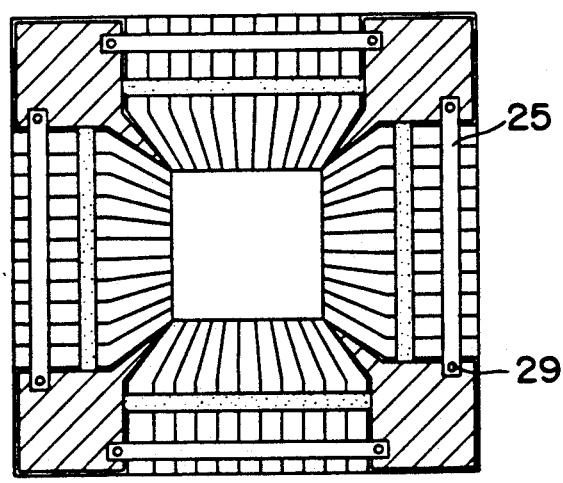
FIG. 3 is a top plan view of a leadframe according to the present invention after a copper ring has been aligned on top of the outer strips of the film/adhesive combination on each side of each set of leads and spot welded to the leadframe.

Referring now to FIG. 3, four copper strips 25 are aligned on each side of the leadframe (i.e., eight in total), on top of the outer strips 23. These strips are added to support the leads during handling and testing. The laminated copper strips are on all four sides and are welded at the corners to form a segmented ring as described below. The adhesive on all strips is then cured under heat and pressure so that the adhesive flows void free and completely embeds the leads. The curing process involves multistep curing at various temperatures and times and is dependent on the materials chosen for the film/adhesive combination.

Figure 4:
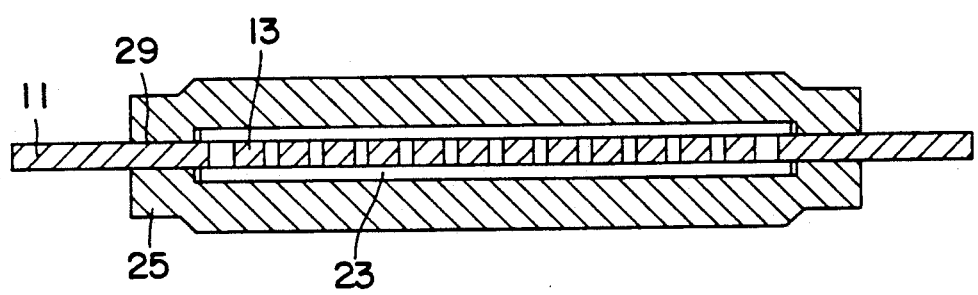
FIG. 4 is a side elevation view showing one side of the leadframe after film/adhesive strips and copper rings have been added.

The ends of the copper strips 25 are then spot welded to the leadframe outside of the film/adhesive strips 23 and leads as shown in FIG. 4 which is a side elevation view from one side of the leadframe. Spot welding is done as in standard practice by opposed electrode resistance welding over a small area on the structure i.e., one electrode is placed on the top surface of the upper mating part and another electrode is placed on the bottom surface of the lower mating part. An electric current is passed through the electrodes, heating and then fusing the mating parts together at the contact point.

The leadframe is now ready to be used for package assembly. Such assembly follows the conventional flow for plastic packages with the following exceptions:

i) Deflashing, either chemical, media, or otherwise, is eliminated.

ii) Dambar removal, either mechanically, with laser, or otherwise, is eliminated.

iii) Units are singulated from the frame as shown in FIG. 5, before forming, and tested while flat and supported.

iv) After test, the units are excised from the rings and are ready for board mount as shown in FIG. 6.

By embedding the leads in a film/adhesive system as described above, the lateral and transverse strength of the leads is significantly increased. This increased strength helps the leads to maintain their positional integrity during shipping, handling, mounting, and the like.

By embedding the leads in a film/adhesive system, the need to use a metal dambar (that has to be removed later) to stop mold flow during transfer molding is eliminated. By eliminating the metal dambar, the dambar removal process can be eliminated. The removal of this process eliminates dambar removal equipment, an assembly process step, and a possible source of yield loss.

It should also be noted that due to the high transfer pressure and temperature used to produce integrated circuit packages, the resins in the mold compound can flash between imperfections in the mating surfaces of the mold and leadframe. These resins must be later removed to insure proper lead finish. The film/adhesive combination used in the present invention acts as a gasket between these mating surfaces and eliminates this flash, and therefore the need for a deflashing step during the process. The removal of this step eliminates deflashing equipment, an assembly process step, and a possible source of yield loss. As noted above, dambar removal techniques either have aspect ratio limits (material thickness vs. lead spacing) for punching, or material thickness limits for laser dambar removal. By eliminating the dambar removal step, material thicknesses can be increased and/or lead pitch and spacing decreased. Furthermore, the copper test ring used in the present invention which is laminated to the copper leadframe using a film/adhesive combination ensures that there is no difference in the thermal coefficient of expansion between the test ring and leadframe. This matched shrinkage helps keep the ring and test contact sites from warping.

The laminated test ring is applied during the leadframe assembly process and therefore any associated yield loss is absorbed at that stage. This keeps ring related yield loss at the lowest cost level; before the die is dedicated to the leadframe.

As previously noted, the laminated test ring is divided into eight sections, four on top of the leadframe and four on bottom of the leadframe. By having the ring segmented instead of one solid piece, forming the leads before trimming them is possible. This helps with uniformity during forming and aids in positional integrity.

We claim:

1. A method for producing a leadframe for use in packaging an integrated circuit for surface mount comprising the steps of
   (a) forming a bare leadframe having a plurality of sets of leads emanating therefrom, which sets of leads each have a top surface and a bottom surface and are for coupling to the integrated circuit;
   (b) adhering a set of inner strips of a film/adhesive combination to the top surface and the bottom surface of each of said plurality of sets of leads;
   (c) adhering a set of outer strips of a film/adhesive combination to the top surface and the bottom surface of each of said plurality of sets of leads;
   (d) aligning a set of copper strips on said set of outer strips such that each copper strip is aligned on a corresponding outer strip, each of said copper strips having two ends;
   (e) curing said adhesive of said film/adhesive combination under heat and pressure so that the adhesive flows substantially void free and substantially completely embeds each of said plurality of sets of leads;
   (f) attaching said two ends of each of said copper strips to said leadframe.

2. The method defined by claim 1 wherein said integrated circuit has a leadcount of at least 200 leads.

3. The method defined by claim 2 wherein said leads have a pitch of less than 0.025 inch.

4. The method defined by claim 1 wherein said inner strips each have a side facing said leadframe and a side facing away from said leadframe, and said film/adhesive coating is only on the side of said inner strips facing the leadframe.

5. The method defined by claim 1 wherein said outer strips each have a side facing said leadframe and a side facing away from said leadframe, and said film/adhesive coating is on said side of said outer strips facing the leadframe and on said side of said outer strips facing away from the leadframe.

6. The method defined by claim 1 wherein said attaching step is performed by spot welding said two ends with opposed electrode resistance welding.

7. The method defined by claim 1 wherein said film/adhesive combination comprises a polyimide adhesive.

* * * * *